United States Patent [19]

Butler et al.

[11] 4,000,502
[45] Dec. 28, 1976

[54] SOLID STATE RADIATION DETECTOR AND PROCESS

[75] Inventors: Jack F. Butler, Lexington, Mass.; Gary L. Harnagel, Pomona; James R. Nelson, Jr., Claremont, both of Calif.

[73] Assignee: General Dynamics Corporation, Pomona, Calif.

[22] Filed: Nov. 5, 1973

[21] Appl. No.: 413,083

[52] U.S. Cl. .............................. 357/15; 250/338; 250/370; 250/371; 250/372; 357/30; 357/53; 357/84; 357/68; 357/71; 156/17
[51] Int. Cl.$^2$ ............... H01L 29/48; H01L 21/306
[58] Field of Search ......... 250/338, 370, 371, 372; 357/15, 30, 84, 68, 71, 53; 156/17

[56] References Cited
UNITED STATES PATENTS

| | | | |
|---|---|---|---|
| 3,146,138 | 8/1964 | Shirland | 357/15 |
| 3,372,317 | 3/1968 | Yamashita | 357/30 |
| 3,541,403 | 11/1970 | Lepselter et al. | 357/15 |
| 3,674,476 | 7/1972 | Tamai et al. | 252/501 |
| 3,717,799 | 2/1973 | Chapman | 357/15 |
| 3,753,774 | 8/1973 | Veloric | 357/15 |
| 3,799,803 | 3/1974 | Kraus et al. | 156/17 |
| 3,823,015 | 7/1974 | Fassett | 156/17 |

Primary Examiner—Maynard R. Wilbur
Assistant Examiner—S. C. Buczinski
Attorney, Agent, or Firm—Neil F. Martin; Edward B. Johnson

[57] ABSTRACT

A radiation detector that combines the characteristics of high quantum efficiency in the UV spectrum with good IR transmission characteristics so that it may be used in association with an IR sensor to produce a coaxial transducer suitable for use in association with unfiltered, high-resolution optics. The detector is a solid state photovoltaic Schottky barrier semi-conductor junction comprising a thin platinum layer laid over single-crystal cadmium sulfide. Processing, including lapping, polishing, and chemical etch, produces a surface suitable for providing radiation sensitivity which drops off sharply outside of the ultraviolet spectrum beyond 550 nanometers. The platinum layer is approximately 35 angstroms in thickness and is therefore transparent both to ultraviolet and infrared radiation. The infrared radiation passes through the cadmium sulfide wafer and through a window in the indium ohmic contact surface on the second surface of the cadmium sulfide crystal. An infrared sensor positioned in association with this window will be exposed to up to 85% of the incident infrared radiation.

9 Claims, 12 Drawing Figures

PREPARE CRYSTALLINE WAFER WITH 2 PARALLEL SURFACES

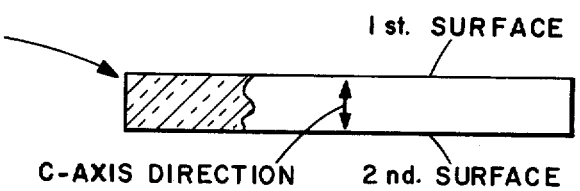

1st. SURFACE
C-AXIS DIRECTION   2nd. SURFACE

POLISH 1st. SURFACE

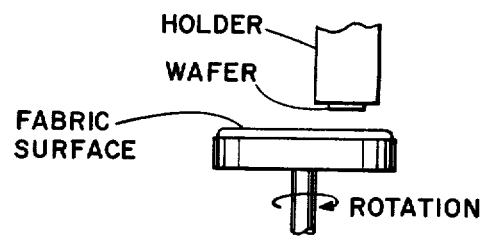

HOLDER
WAFER
FABRIC SURFACE
ROTATION

ETCH 1st. SURFACE (WITH PHOSPHORIC ACID)

DEPOSIT PLATINUM ON 1st. SURFACE IN MATRIX PATTERN

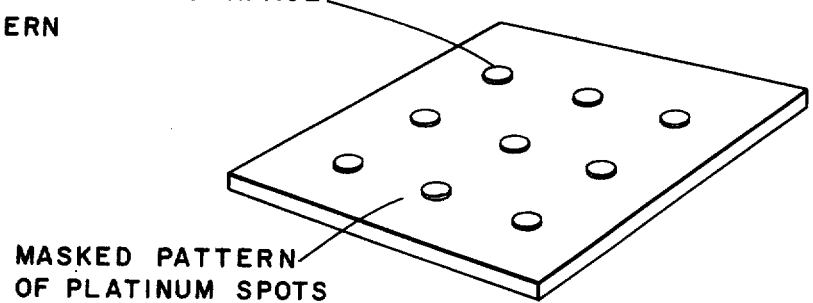

MASKED PATTERN OF PLATINUM SPOTS

DEPOSIT 1st. LAYER OF PERMANENT PHOTO-RESIST AROUND PLATINUM

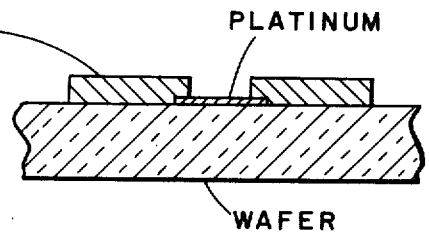

PLATINUM
WAFER

DEPOSIT COPPER LAYER ON PERMANENT PHOTO-RESIST

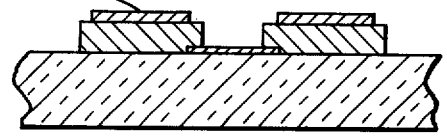

Fig. 11a

SOLID STATE RADIATION DETECTOR AND PROCESS

BACKGROUND OF THE INVENTION

There exists a demand in high technology optical systems, such as in the optical guidance systems for radiation seeking missiles, for a high quantum efficiency, short-time response, solid state detector. The detector must have a high response to near ultra-violet radiation, but be substantially insensitive to radiation in the visible spectrum.

Silicon photodiodes have been proposed for these applications; however, such photodiodes are sensitive to the visible spectrum through approximately 800 nanometers, and therefore must be used in association with optical filtering to remove the visible radiation. Additionally, these detectors have a relatively low quantum efficiency (30% or less).

Cadmium sulfide based solid state detectors have been utilized in solid state radiation detectors; however, the known characteristics of cadmium sulfide detectors suggest that they are useful primarily in the visible range, and are relatively insensitive to ultraviolet radiation. Therefore, it is desirable to provide a solid state detector sensitive to ultraviolet radiation and transparent to infrared radiation, particularly if such a detector can be fabricated to have a relatively small active area so that it may be utilized in conjunction with high resolution optics, and made to have a high quantum efficiency.

SUMMARY OF THE INVENTION

In an exemplary embodiment of the detector and the process of its manufacture, a single crystalline blank of cadmium sulfide is fabricated into a wafer having a thickness of approximately 0.010 inch. In high volume production, the wafer will be sized to provide sufficient crystal area for a matrix of detector elements. In the exemplary embodiment, a 3×3 matrix is utilized. Since the diameter of an individual detector element is on the order of 0.02 inch, the 3×3 matrix can be accommodated on a 5 millimeter square wafer. The crystal orientation is such that the large area surfaces of the wafer are perpendicular to the crystal c-axis and the cadmium rich surface is identified.

After lapping, the wafer is polished, utilizing a fabric covered lapping plate. Then the lapped and polished wafer is chemically etched to remove the damage created by the mechanical lapping and polishing operations. A multi-step acid etch is utilized, incorporating at least one immersion in concentrated phosphoric acid.

The active area of the sensor is produced on the negative or cadmium rich surface of the crystal, as it is this surface referred to as the top surface that is most favorably affected by the etching operations. This top surface is masked to define the active area, and a 35 angstrom depth of platinum is evaporated onto the crystal. The positive surface referred to as the bottom surface, opposite the top surface, is next treated by depositing a layer of indium approximately 2000 angstroms in depth. The indium layer constitutes an ohmic contact with the crystal. At this stage, the detectors are substantially complete, absent the mounting and conductive connections, and the steps for cutting up the original blank into individual detectors. The detector thus produced is highly sensitive to ultraviolet radiation and exhibits a high quantum efficiency in the range between 300 and 500 nanometers. At wavelength greater than 500 nanometers, a sharp drop-off in quantum efficiency is experienced. UV quantum efficiencies in excess of 0.7 are obtainable, and in detectors with visible light quantum efficiencies of less than 0.05.

In the production of the UV/IR sandwich transducer configuration, the same basic steps employed in the production of the UV only sensor, described above, are employed. In addition, a pattern of permanent photo-resist and functional elements are developed to provide the additional structure necessary for the combined configurations. Contact masks are employed to expose positive working photo-resist. The masks accurately position the insulative permanent photo-resist layers and conductive layers. A first insulative photo-resist layer surrounds the platinum area and provides a base for a 1,000 angstrom copper infrared radiation shield. The shield blocks out infrared radiation from passing through the crystal, except through the active element, thereby avoiding extraneous signals. This shield is encased in a second permanent photo-resist layer that insulates and isolates the IR shield to minimize the capacity of the detector. A conductive copper ring is deposited into contact with the periphery of the platinum area, thereby providing a low resistance contact with the copper area.

In an additional modification to the process utilized in the UV only detector, a window is produced in the indium ohmic contact. The window is aligned with the active platinum area, and thus passes all of the IR radiation transmitted by the crystal.

With either process, the various detectors in the matrix are separated using a wire saw or similar device to cut up the individual cells and separate them from the matrix. The individual cells may then be completed by connecting conductive elements to the copper ring and indium surface. A final layer of magnesium fluoride may be evaporated onto the surfaces protecting them and reducing reflections in the ultraviolet range.

It is therefore an object of the invention to provide a new and improved solid state radiation detector.

It is another object of the invention to produce a radiation detector with increased quantum efficiencies in the UV spectrum.

It is another object of the invention to provide a new and improved UV detector with a small active area.

It is another object of the invention to provide a new and improved UV detector which passes a substantial percentage of infrared radiation.

It is another object of the invention to provide a new and improved radiation detector with a fast reaction time, i.e., a short time constant.

It is another object of the invention to provide a new and improved UV detector which is susceptible to high volume production.

It is another object of the invention to provide a new and improved radiation detector which is sensitive to ultraviolet radiation but substantially insensitive to most visible radiation.

Other objects and many attendant advantages of the invention will become more apparent upon a reading of the following detailed description together with the drawings, in which like reference numerals refer to like parts throughout, and in which:

FIGS. 11a and 11b illustrates the various steps of the method of manufacture.

Figure 1:
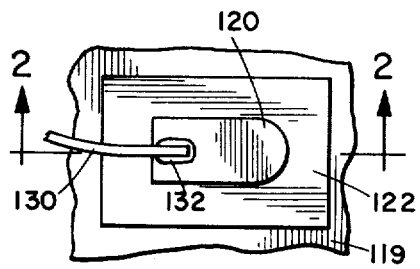
FIG. 1 is a top plan view of a detector for UV only.

Referring now to the drawings, a specific embodiment of the invention will be described in conjunction with the production of a 3×3 matrix of ultraviolet detectors suitable for use in the UV/IR detector sandwich. It is understood that this is a complex form of the invention, and that the UV only detector, while incorporating the same principles, may be produced by substantially simpler processing techniques.

The base material for the transducer is a blank of single crystalline cadmium sulfide material such as is available from Harshaw Chemical Company and designated as material of the N-type with a resistivity of 1 to 10 ohm-cm, a carrier concentration of $10^{15} - 10^{16}$ cm$^{-3}$ and a carrier mobility of at least 200 cm$^2$ - v$^{-1}$ SEC$^{-1}$. The blank is oriented so that the large area surfaces are perpendicular to the crystal c-axis, and the negative (cadmium rich) surface is identified. It is understood that the blank is of sufficient size to produce a matrix of detector elements, and for exemplary purposes, is sized to accept a 3×3 matrix.

The wafer blank is mounted on a lapping holder and placed on a rotating metal lapping plate, for example, a steel lapping plate. A lapping slurry of 5 micron alumina powder in Micro Oil number one is applied approximately every 30 seconds. The original one millimeter thickness blank is lapped on both sides to obtain parallel surfaces, and a total thickness of 0.010 inch.

An individual lapped wafer is mounted on a light-weight holder and placed in contact with a silk screen covered rotating lapping plate. A polishing slurry of 0.05 microns alumina powder, diluted with water and a small quantity of glycerol, is applied approximately every thirty seconds to the lapping plate and wafer. Polishing continues until inspection reveals that all of the surface is polished. After chemical etching, the process is repeated on the opposite side as this surface must be given a high transparency to pass IR radiation.

A chemical etch of the wafer is employed utilizing plural acid baths. During handling, the wafer is moved and supported utilizing teflon tweezers and a platinum mesh basket to avoid contamination and damage. The first acid etch bath utilizes 18% hydrochloric acid at room temperature. The bath is agitated slightly to ensure even etch. After approximately 1 minute of etching, the wafer is washed in demineralized water with agitation again being utilized to completely remove the acid. A further cleansing operation is employed utilizing vigorously boiling, reagent grade isopropanol.

After drying, the wafer is inserted in a bath of 85% phosphoric acid, heated to approximately 150° C, and maintained in the bath for one and one half hours with continuous stirring. The water, isopropanol and drying operations are repeated and the wafer inserted again in 18% hydrochloric acid for approximately twenty seconds. An additional wafer, isopropanol and drying cycle is accomplished, and a second immersion in 150° C, 85% phosphoric acid is utilized for fifteen minutes, again with continuous stirring, and again followed by immersion in demineralized water and isopropanol. A final drying operation is accomplished and the wafer inspected to ensure that the cadmium rich surface has a glassy appearance with a horizontal etched pattern visible under a microscopic examination. This ensures that the etching steps have produced an even and thoroughly treated surface.

Figure 5:
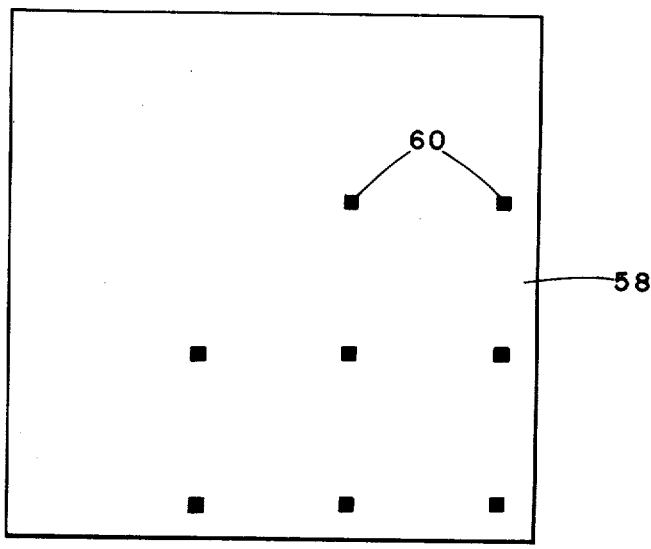
FIGS. 5 - 10 illustrate masks used sequentially in the process of making the detector.

The various metalized and insulative layers to be built up on the crystal surfaces are developed through the use of photo-resist techniques. For this purpose, a series of masks such as those illustrated in FIGS. 5 through 10 are employed. In actual practice, the photo masks are opaque where the photo-resist is to remain, and transparent where the photo-resist is to be removed. However, for ease of illustration, the masks of FIGS. 5 and 6 only are shown in the negative with the masks transparent where the photo-resist is to remain. The mask illustrated in FIG. 5 is utilized to define a series of squares from which subsequent patterns are aligned. In preparation for the photo-resist operations, the matrix wafer is mounted on a glass slide with canada balsam dissolved in toluene. The cure of the canada balsam is accomplished by baking the assembly for an hour at 120° C. After cooling, the excess canada balsam is removed from crystal surface with toluene until it is completely free of foreign material.

The surface of the crystal is covered by a photo-resist, a suitable photo-resist being Shipley AZ1350 and AZ1305H, in a one to one mixture. The photo-resist is spread over the crystal surface by spinning the crystal-on-glass assembly at 5,000 rpm for 20 seconds.

It is to be understood that unless otherwise indicated, all operations involving photo-resist are performed in a room with protection against extraneous blue or ultraviolet light to avoid premature exposure of the photo-resist material. The photo-resist is dried using a red filtered heat lamp and the target mask placed in contact with the photo-resist surface. The photo-resist is exposed to ultraviolet light through the target mask 58 illustrated in FIG. 5, so that the squares 60 on the photo-resist are illuminated.

Shipley AZ1350 developer is utilized for twenty seconds to develop the exposed areas and after rinsing in water and drying in filtered air, the developed pattern produces exposed crystal surface in the areas indicated by the numeral 60 in FIG. 5. When the crystal is placed in a vacuum evaporating system and 600 angstroms of silver are deposited, the silver will overlie and be in contact with the crystal surface only in the exposed areas. Thereafter, the crystal is placed in acetone which dissolves the unexposed photo-resist from underneath the silver deposited layers, and the silver, therefore, may be removed. Any silver which clings to the crystal surface may be removed with a jet of acetone, assisted if necessary by a partially depilated camel hair brush.

Figure 6:
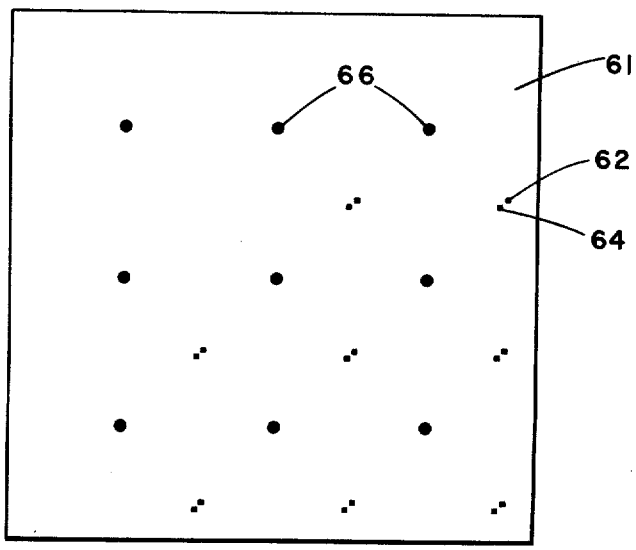

After drying, additional photo-resist is applied and spread over the crystal surface and the mask 61 of FIG. 6 employed. The mask is optically aligned with the squares 62 and 64 positioned within the squares 60 of the silvered pattern from the target mask of FIG. 5. The mask 61 contains a pattern of circles 66 that will be utilized to deposit the platinum, and later again utilized to deposit a layer of photo-resist. The platinum circles 66 are 0.006 inch in diameter.

With the mask in position, the photo-resist is exposed and then developed in the previously described manner. The crystal is then placed in an evaporating station and 35 angstroms of platinum deposited. The depth of platinum is controlled to within plus or minus 5 angstroms as determined by measurement with a Talystep I profilometer. Acetone is employed to remove the photo-resist from under the platinum, and therefore permit the removal of the excess platinum in a manner comparable to the removal of the excess silver as previously described.

Figure 7:
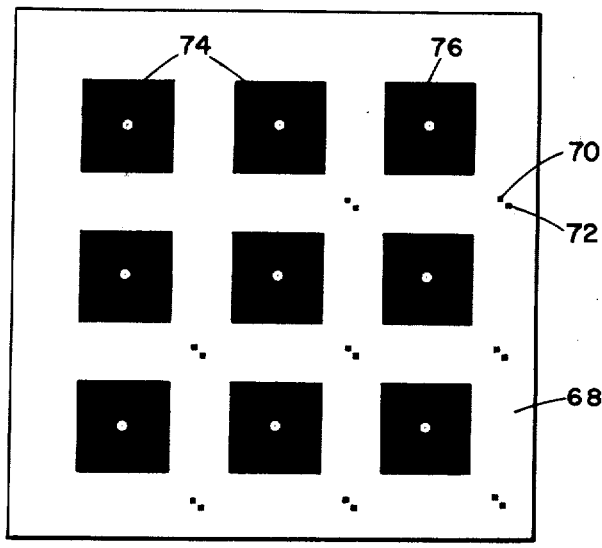
Figure 8:
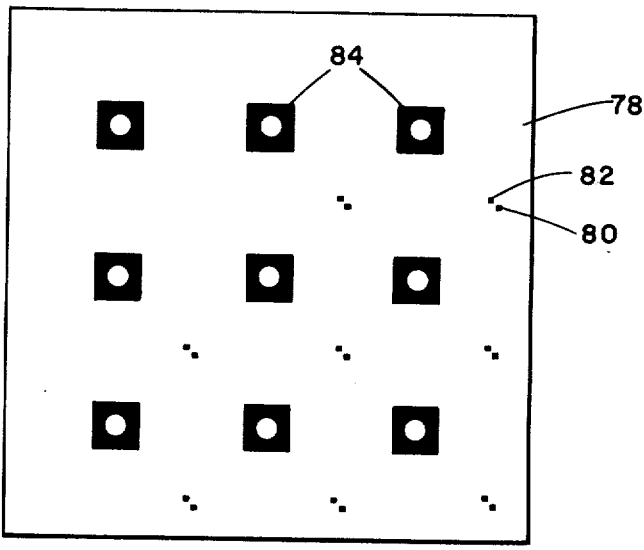
Figure 9:
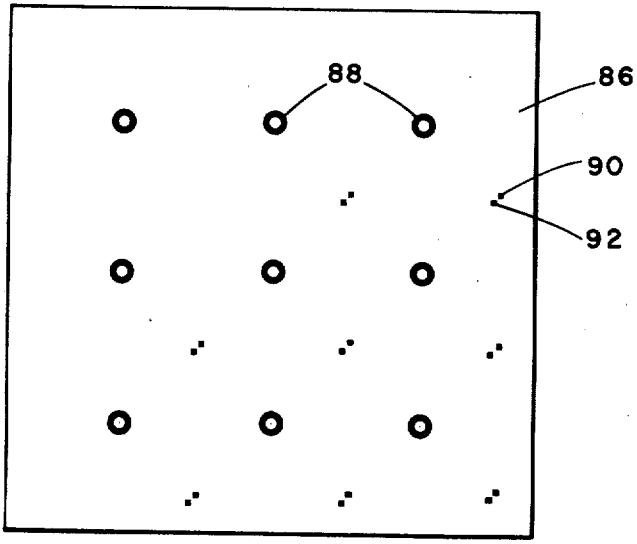
Figure 10:
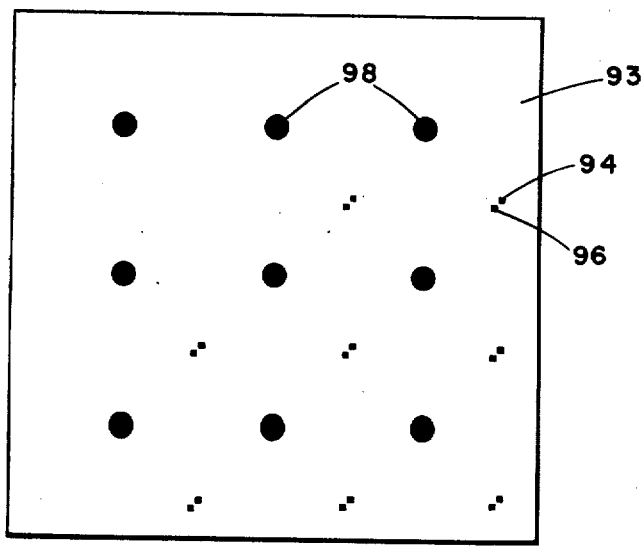
Figure 11B:
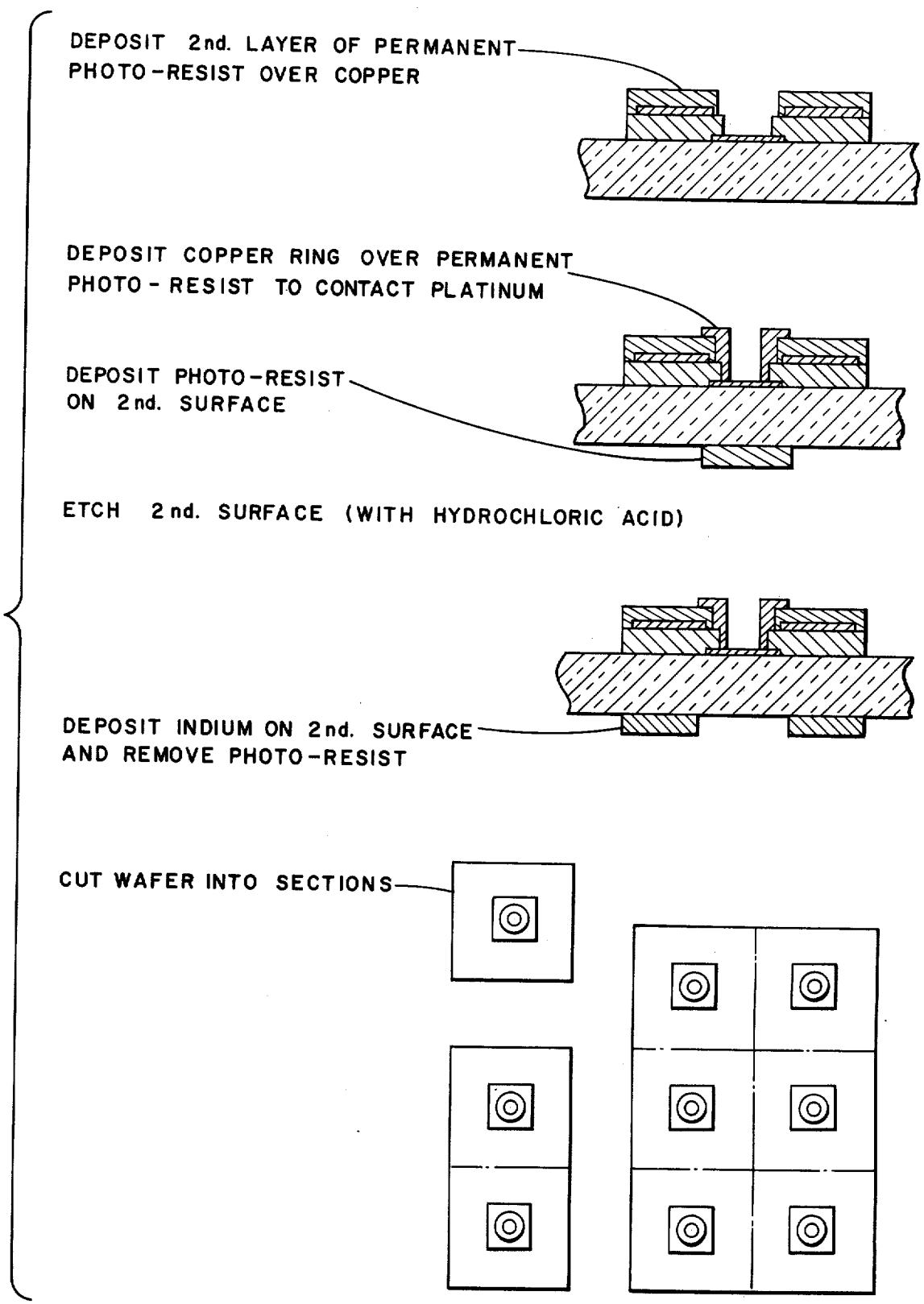

The first permanent photo-resist layer is defined by the mask 68 in FIG. 7 which includes the alignment squares 70 and 70. The alignment squares are oriented to lie on the opposite diagonal of the squares 60 than the alignment squares 62 and 64 and therefore be precisely related to these squares. The mask 68 also provides the square photo-resist areas 74, which provide for an opening 76 corresponding to and aligned with the previously deposited platinum layer. The mask 68 is aligned and the photo-resist exposed and developed in the previously described manner leaving a photo-resist pattern corresponding to the area 74 in FIG. 7. The photo-resist layer is made permanent by baking in a 160° C oven for approximately 2 hours. The baking protects the desired photo-resist and this desired material is not removed by a subsequent bath in acetone followed by an acetone rinse and drying with air and heat.

The crystal is placed in a vacuum evaporating station and 1,000 angstroms, plus or minus 100 angstroms, of copper is deposited over the entire crystal photo-resist and platinum surfaces. Next, photo-resist is deposited, spread and dried as previously described, and the mask 78 illustrated in FIG. 8 aligned using the alignment squares 80 and 82. The exposure of the photo-resist through this mask exposes the entire surface of the deposited photo-resist excepting that under the pad 84 which is to become the infrared shield. The photo-resist is then developed in the previously described manner which exposes the copper over the entire area excepting as it is protected by the photo-resist layer 84.

The unprotected copper is dissolved using a ferric chloride solution in a concentration of 15 grams per 100 milliliters of deionized water. The ferric chloride attacks and dissolves the copper without damaging the platinum active area.

The photo-resist is dissolved in acetone and a new photo-resist layer applied, which is developed by the mask 61 in FIG. 6. This mask is utilized for the second time to deposit an overall photo-resist layer covering the entire surface of the crystal excepting the platinum active area. The layer covers the copper IR shield with an insulative layer which is made permanent by heating as previously described.

A final layer of copper, to a depth of 6,500 plus or minus 500 angstroms, is deposited over the second permanent photo-resist surface. The copper extends over the steps and down into contact with the platinum active area. Additional photo-resist is applied and developed through the mask 86 in FIG. 9 so that all of the then applied photo-resist is removed by development except in the area of the element 88. Alignment is accomplished by the squares 90 and 92. A ferric chloride solution is then utilized to dissolve the copper over the entire surface excepting under the photo-resist pattern, and the photo-resist layer over the copper ring is then removed with acetone.

The crystal wafer may now be removed from the glass slide, as by soaking it in a beaker of toluene or xylene under mild ultrasonic treatment, if necessary, to aid in the removal. The crystal is then inverted, and again secured to the glass slide, this time with the platinum layer down. The previously described canada balsam securing technique is utilized. A photo-resist layer is applied and a mask 93 according to FIG. 10 utilized. The alignment marks 94 and 96 are utilized in conjunction with the original silvered targets, but aligned through the rear face of the crystal. The photo-resist is exposed to ultraviolet, excepting over the areas of the circles 98, which correspond to the windows for passing infrared radiation, and are approximately 0.011 inch in diameter.

A one to one concentrated hydrochloric acid solution is utilized on the exposed crystal surface to etch the surface in preparation for the application of the ohmic layer. The crystal is dried by air and heat and placed in an evaporating station where 2,000 plus or minus 200 angstroms of indium are deposited. The photo-resist covering the windows is dissolved with acetone. The crystal may now be removed from the holder by the previously described procedure and is ready for being cut into individual detector elements. A wire saw such as a wire saw incorporating a 0.005 inch diameter blade as manufactured by South Bay Technology is utilized for cutting. During the sawing operations, an abrasive slurry of 5 micron alumina powder in glycerol and water is applied. A gold lead wire is secured to the copper ring by conductive epoxy such as Emerson and Cuming Eccobond 56 C, and a final layer of magnesium fluoride evaporated onto the surfaces to a depth of 550 angstroms to passivate and protect the detector from atmospheric contamination and to reduce reflections in the ultraviolet range to pass maximum ultraviolet radiation.

Figure 3:
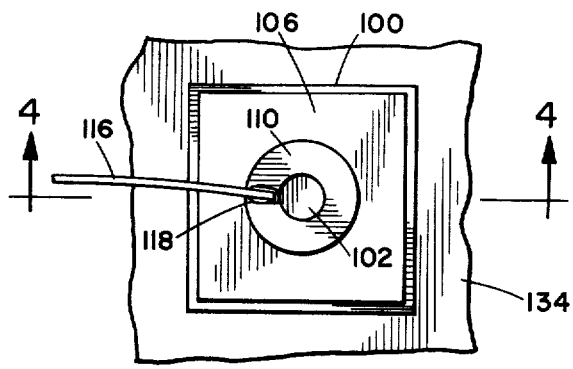
FIG. 3 is a top plan view of a detector for UV and IR use.
Figure 4:
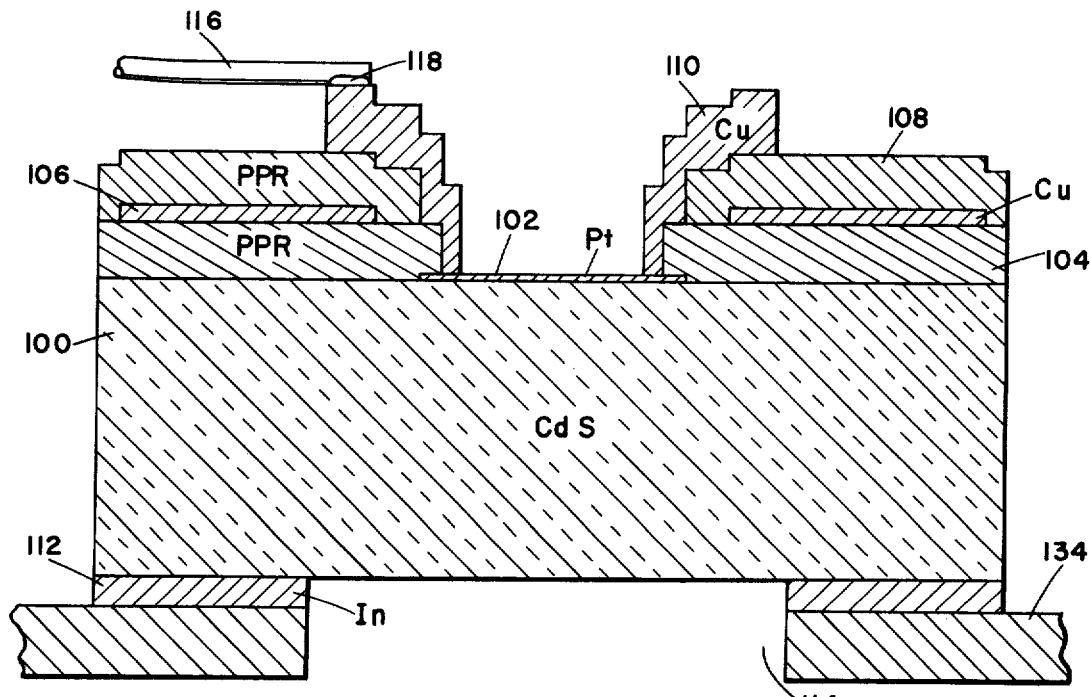
FIG. 4 is an enlarged sectional view taken on line 4—4 of FIG. 3.

The physical configuration of the completed detector is illustrated in FIGS. 3 and 4, and includes the cadmium sulfide wafer 100. The 35 angstrom platinum layer 102 is deposited on the polished and etched negative (cadmium rich) surface of the crystal. The first photo-resist layer 104 overlies the extreme outer periphery of the platinum area and insulates the copper infrared shield 106 from the crystal surface and platinum layer. The second photo-resist surface 108 encapsulates the IR shield and insulates the IR shield from the copper ring 110. The copper ring 110 steps down the levels of the photo-resist 104 and 108 to the surface of the platinum layer 102 and makes electrical contact therewith. The copper ring 110 shields a portion of the platinum active area resulting in the active area in the instant embodiment having a diameter of 0.004 inch.

The bottom face of the cadmium sulfide crystal has a 2,000 angstrom thickness of indium 112, interrupted by an opening or IR window 114. The IR window is 0.011 inch in diameter and thus passes substantially all of the incident infrared radiation passed through the transparent platinum surface 102 and the cadmium sulfide crystal 100. The IR/UV sandwich configuration, an IR detector would be positioned in axial alignment with the platinum area and IR window to be illuminated by and detect the IR radiation passing through the crystal.

A gold wire 116 is secured to the copper ring 110 by a layer of conductive epoxy 118. Thus a circuit may be established between the active area through the wire 116 and the ground portion or ohmic contact 112 which is bonded to a conductive mounting 134.

Figure 2:
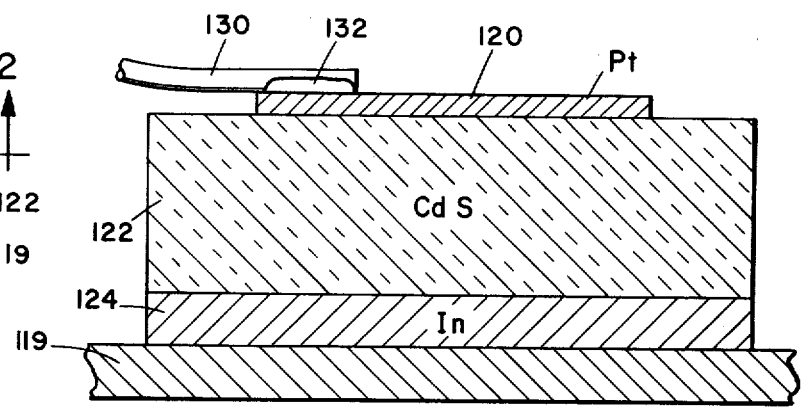
FIG. 2 is an enlarged sectional view taken on line 2—2 of FIG. 1.

FIGS. 1 and 2 illustrate a simplified version of the detector which comprises a UV only detector thereby eliminating the necessity for an IR window and IR shield. The detector comprises a platinum active area 120 on a crystal 122 and backed by an ohmic indium contact surface 124 for bonding to a conductive mounting 119. A gold wire 130 may be bonded directly to the platinum area by adhesive conductive epoxy 132.

Having described our invention, we now claim,

1. A solid state radiation detector utilizing a Schottky barrier in a photovoltaic detector configuration wherein the improvement comprises:
   a wafer of crystalline cadmium sulfide having first and second surfaces;
   a layer of platinum on said first surface of said wafer, said platinum layer being sufficiently thin to be substantially transparent to ultraviolet radiation, said platinum layer being additionally substantially transparent to infrared radiation;
   an insulating layer on said first surface of said wafer, said insulating layer disposed to define an active area of said platinum layer;
   a first metallic member superimposed on said insulating layer making contact with said active area of said platinum layer, said first metallic member substantially shielding said wafer from infrared radiation in that area of said wafer outside said active area of said platinum layer;
   said second surface of said wafer having an area defining a window substantially directly opposite said active area of platinum layer, said area on said second surface allowing the passage therethrough of infrared radiation; and
   a second metallic member making contact with said second surface of said wafer.

2. A solid state radiation detector utilizing a Schottky barrier in a photovoltaic detector configuration wherein the improvement comprises:
   a wafer of crystalline cadmium sulfide having first and second surfaces;
   a layer of platinum on said first surface of said wafer, said platinum layer being sufficiently thin to be substantially transparent to ultraviolet radiation, said platinum layer being additionally substantially transparent to infrared radiation;
   first and second insulating layers on said first surface of said wafer, said insulating layers disposed to define an active area of said platinum layer;
   an infrared shield interposed between said first and second insulating layers;
   a first metallic member on said first insulating layer making contact with said active area of said platinum layer;
   said second surface of said wafer having an area defining a window substantially directly opposite said active area of said platinum layer, said area on said second surface allowing the passage therethrough of infrared radiation; and
   a second metallic member making contact with said second surface of said wafer.

3. A process of fabricating a solid state photovoltaic radiation detector comprising the steps of:
   removing material from a single crystaline wafer to produce a wafer having two substantially parallel planar surfaces perpendicular to the crystal C-axis;
   polishing a first surface of said wafer;
   chemically etching said first surface;
   depositing a layer of platinum on said surface;
   said platinum layer deposited on selected areas of said wafer to produce a matrix of platinum layered areas;
   depositing a first layer of permanent photo-resist material surrounding each of said platinum layers;
   depositing a copper layer on said first layer of photo-resist;
   depositing a second layer of photo-resist over said copper layer and completely insulating said copper layer; and
   depositing a copper ring on said second layer of photo-resist and in contact with said platinum layer; and
   cutting said wafer into a plurality of elements, each of said elements having a platinum layered area substantially centered thereon.

4. A solid state radiation detector utilizing a Schottky barrier in a photovoltaic detector configuration wherein the improvement comprises:
   a wafer of crystaline semiconductor material having a planar top surface;
   a layer of platinum on the top surface of said wafer, said platinum layer being sufficiently thin to be substantially transparent to ultraviolet radiation;
   contact means for making ohmic contact with said wafer;
   said platinum layer extends over a defined area on the top surface of said wafer, and said contact means disposed on the bottom face of said wafer and having an opening aligned with said platinum area.

5. The solid state radiation detector of claim 4, wherein said wafer comprises a single crystal of N-type cadmium sulfide having the crystal c-axis perpendicular to the plane of said top surface.

6. The solid state radiation detector of claim 4, wherein said contact means comprises a metallized layer on the bottom surface of said wafer.

7. A solid state radiation detector of claim 4, wherein said contact means comprises a layer of indium.

8. The solid state radiation detector of claim 4, wherein said platinum layer is contacted through a copper ring, said copper ring shielding a portion of said wafer from infrared radiation.

9. A solid state radiation detector utilizing a Schottky barrier in a photovoltaic detector configuration wherein the improvement comprises:
   a wafer of crystaline semiconductor material having a planar top surface;
   a layer of platinum on the top surface of said wafer, said platinum layer being sufficiently thin to be substantially transparent to ultraviolet radiation;
   contact means for making ohmic contact with said wafer;
   and a planar infrared radiation shield comprising a layer of copper surrounding said platinum layer, said infrared shield electrically insulated from said platinum layer and said wafer, said infrared shield lowering the capacitance of said detector.

* * * * *